United States Patent
Poole et al.

(10) Patent No.: US 6,946,733 B2
(45) Date of Patent: Sep. 20, 2005

(54) BALL GRID ARRAY PACKAGE HAVING TESTING CAPABILITY AFTER MOUNTING

(75) Inventors: David Poole, Portland, IN (US); Terry R. Bloom, Middlebury, IN (US); Richard Cooper, Bluffton, IN (US)

(73) Assignee: CTS Corporation, Elkhart, IN (US)

( * ) Notice: Subject to any disclaimer, the term of this patent is extended or adjusted under 35 U.S.C. 154(b) by 0 days.

(21) Appl. No.: 10/640,073

(22) Filed: Aug. 13, 2003

(65) Prior Publication Data

US 2005/0035450 A1 Feb. 17, 2005

(51) Int. Cl.$^7$ .............................................. H01L 23/48
(52) U.S. Cl. .......................... 257/737; 257/528; 257/774
(58) Field of Search ................................. 257/734–737, 257/774–778, 528–532, 723; 380/320, 329

(56) References Cited

U.S. PATENT DOCUMENTS

| | | |
|---|---|---|
| 3,280,378 A | 10/1966 | Brady |
| 3,346,774 A | 10/1967 | Brady |
| 3,492,536 A | 1/1970 | Girolamo |
| 3,849,757 A | 11/1974 | Khammous |
| 4,225,468 A | 9/1980 | Donohue |
| 4,300,115 A | 11/1981 | Ansell |
| 4,332,341 A | 6/1982 | Minetti |
| 4,626,804 A | 12/1986 | Risher |
| 4,654,628 A | 3/1987 | Takayanagi |
| 4,658,234 A | 4/1987 | Takayanagi |
| 4,712,161 A | 12/1987 | Pryor |
| 4,757,610 A | 7/1988 | McElheny |
| 4,759,491 A | 7/1988 | Fisher |
| 4,791,473 A | 12/1988 | Phy |
| 4,933,741 A | 6/1990 | Schroeder |
| 4,945,399 A | 7/1990 | Brown |
| 4,992,628 A | 2/1991 | Beppu |
| 5,029,325 A | 7/1991 | Higgins |
| 5,140,407 A | 8/1992 | Kamada |
| 5,142,351 A | 8/1992 | Matta |
| 5,216,404 A | 6/1993 | Nagai |
| 5,220,199 A | 6/1993 | Owada |
| 5,255,839 A | 10/1993 | Da Costa Alves |
| 5,272,590 A | 12/1993 | Hernandez |
| 5,352,926 A | 10/1994 | Andrews |
| 5,371,405 A | 12/1994 | Kagawa |
| 5,379,190 A | 1/1995 | Hanamura |
| 5,382,827 A | 1/1995 | Wang |
| 5,400,220 A | 3/1995 | Swamy |
| 5,420,460 A | 5/1995 | Massingill |
| 5,424,492 A | 6/1995 | Petty |
| 5,450,055 A | 9/1995 | Doi |
| 5,467,252 A | 11/1995 | Nomi |

(Continued)

FOREIGN PATENT DOCUMENTS

| | | |
|---|---|---|
| EP | 0924755 A2 | 6/1999 |
| JP | 08222656 A | 8/1996 |
| WO | WO97/30461 | 8/1997 |

*Primary Examiner*—Nathan J. Flynn
*Assistant Examiner*—Leonardo Andújar
(74) *Attorney, Agent, or Firm*—Mark P. Bourgeois; Daniel J. Deneufbourg

(57) ABSTRACT

A ball grid array package that can be readily tested before or after mounting to a printed circuit board. The ball grid array includes a substrate having a top surface and a bottom surface. Several conductive pads are located on the top surface. Several passive circuit elements are located on the top surface between the conductive pads. An insulative coating is placed on top of the passive circuit elements and the substrate. The insulative coating has openings over the conductive pads. The openings are adapted to be accessible by an electrical probe. Conductive vias extend through the substrate between the top and bottom surfaces. The vias electrically connect with the conductive pad on the top surface. Several conductive balls are located on the bottom surface. Each conductive ball is electrically connected to one of the vias.

6 Claims, 3 Drawing Sheets

U.S. PATENT DOCUMENTS

| | | |
|---|---|---|
| 5,491,303 A | 2/1996 | Weiss |
| 5,509,200 A | 4/1996 | Frankeny |
| 5,528,083 A | 6/1996 | Malladi |
| 5,530,288 A | 6/1996 | Stone |
| 5,539,186 A | 7/1996 | Abrami |
| 5,557,502 A | 9/1996 | Banerjee |
| 5,559,363 A | 9/1996 | Immorlica |
| 5,574,630 A | 11/1996 | Kresge |
| 5,607,883 A | 3/1997 | Bhattacharya |
| 5,621,619 A | 4/1997 | Seffernick |
| 5,629,838 A | 5/1997 | Knight |
| 5,635,767 A | 6/1997 | Wenzel |
| 5,636,099 A | 6/1997 | Sugawara |
| 5,661,450 A | 8/1997 | Davidson |
| 5,726,485 A | 3/1998 | Grass |
| 5,729,438 A | 3/1998 | Pieper |
| 5,745,334 A | 4/1998 | Hoffarth |
| 5,760,662 A | 6/1998 | Kalb |
| 5,796,038 A | 8/1998 | Manteghi |
| 5,796,587 A | 8/1998 | Lauffer |
| 5,870,274 A | 2/1999 | Lucas |
| 5,903,050 A | 5/1999 | Thurairajaratnam |
| 5,923,077 A | 7/1999 | Chase |
| 5,977,863 A | 11/1999 | Bloom |
| 6,005,777 A | 12/1999 | Bloom |
| 6,081,429 A | 6/2000 | Barrett |
| 6,097,277 A | 8/2000 | Ginn |
| 6,144,213 A * | 11/2000 | Johnson ................... 324/754 |
| 6,159,304 A | 12/2000 | Noguchi |
| 6,180,881 B1 | 1/2001 | Isaak |
| 6,184,475 B1 | 2/2001 | Kitajima |
| 6,189,203 B1 | 2/2001 | Heinrich |
| 6,194,979 B1 | 2/2001 | Bloom |
| 6,229,100 B1 | 5/2001 | Fjelstad |
| 6,245,587 B1 | 6/2001 | Vallett |
| 6,246,312 B1 | 6/2001 | Poole |
| 6,291,268 B1 | 9/2001 | Ho |
| 6,310,301 B1 | 10/2001 | Heinrich |
| 6,326,677 B1 | 12/2001 | Bloom |
| 6,342,398 B1 | 1/2002 | Lin |
| 6,352,871 B1 | 3/2002 | Goruganthu |
| 6,440,228 B1 | 8/2002 | Taguchi |
| 6,682,872 B2 * | 1/2004 | Sachdev et al. ............ 430/311 |

* cited by examiner

BALL GRID ARRAY PACKAGE HAVING TESTING CAPABILITY AFTER MOUNTING

BACKGROUND

1. Field of the Invention

This invention generally relates to electronic packaging. Specifically, the invention is a ball grid array resistor package that can be readily tested before or after mounting to a printed circuit board.

2. Description of the Related Art

One method of circuit component packaging is the use of a ball grid array (BGA) package. The BGA package is typically an array of solder balls on a substrate that also contains circuit components such as integrated circuits, capacitors or resistors. After prior art BGA packages have been mounted to a printed circuit board, the interior balls are not exposed and therefore cannot be tested to ensure proper electrical continuity.

Previously, printed circuit board designers have provided additional test pads on the printed circuit board surrounding the ball grid array package. These test pads are electrically connected by an internal circuit line to one of the interior balls on the BGA package. The test pads are probed by a metal probe. Unfortunately, these test pads require extra space on the printed circuit board and add additional expense.

What is desired is a ball grid array package with easy access to the internal balls of the BGA device without extensive modifications to the underlying printed circuit board. Therefore, there is a current unmet need for a ball grid array package that can be tested after mounting to a printed circuit board.

SUMMARY

A feature of the invention is to provide a ball grid array package that can be readily tested before or after mounting to a printed circuit board.

Another feature of the invention is to provide a ball grid array that includes a substrate having a top surface and a bottom surface. Several conductive pads are located on the top surface. Several passive circuit elements are located on the top surface between the conductive pads. An insulative coating is placed on top of the passive circuit elements and the substrate. The insulative coating has openings over the conductive pads. The openings are adapted to be accessible by an electrical probe. Conductive vias extend through the substrate between the top and bottom surfaces. The vias electrically connect with the conductive pad on the top surface. Several conductive balls are located on the bottom surface. Each conductive ball is electrically connected to one of the vias.

DETAILED DESCRIPTION

Figure 1:
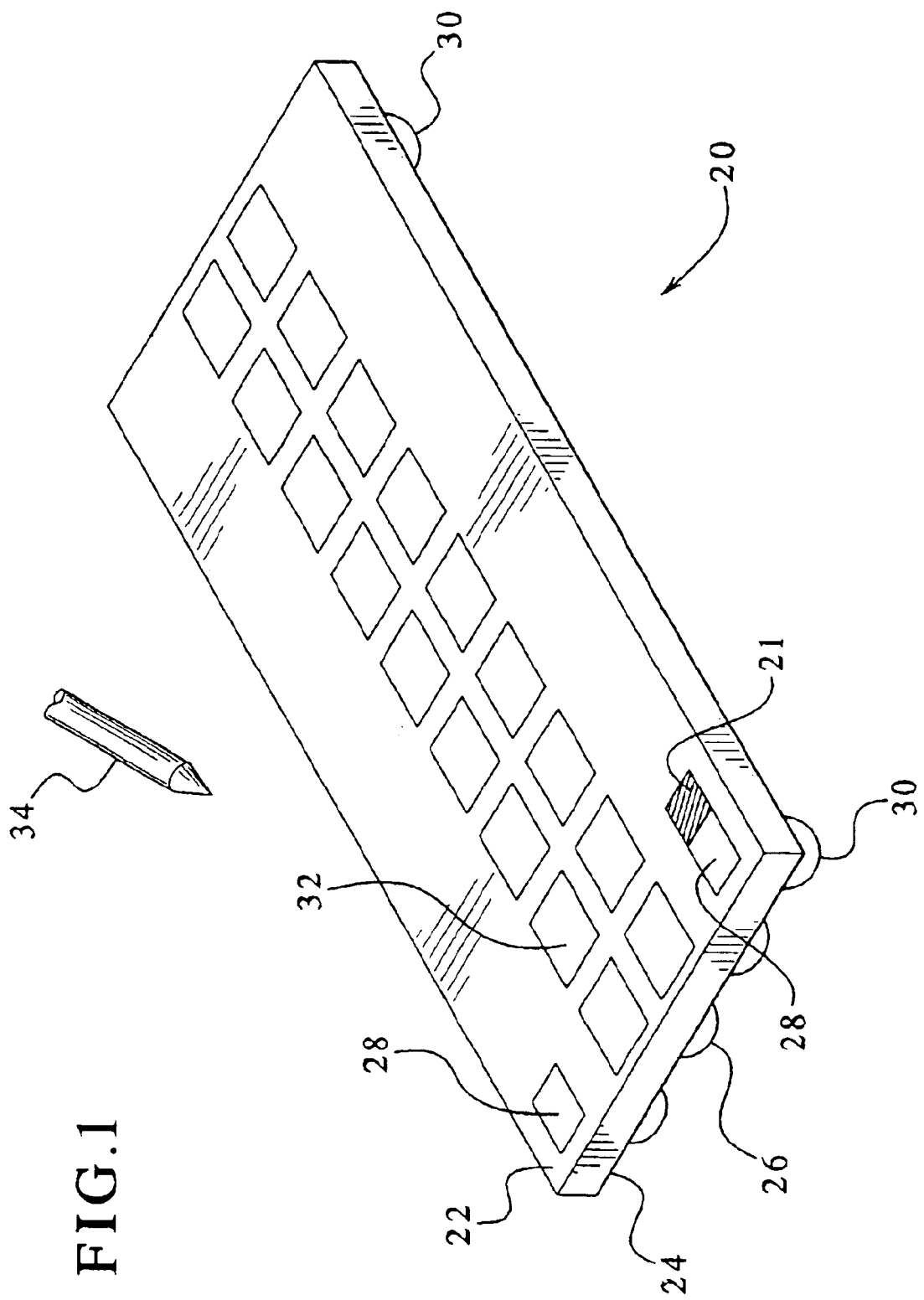
FIG. 1 is a perspective view of a ball grid array according to the present invention.
Figure 2:
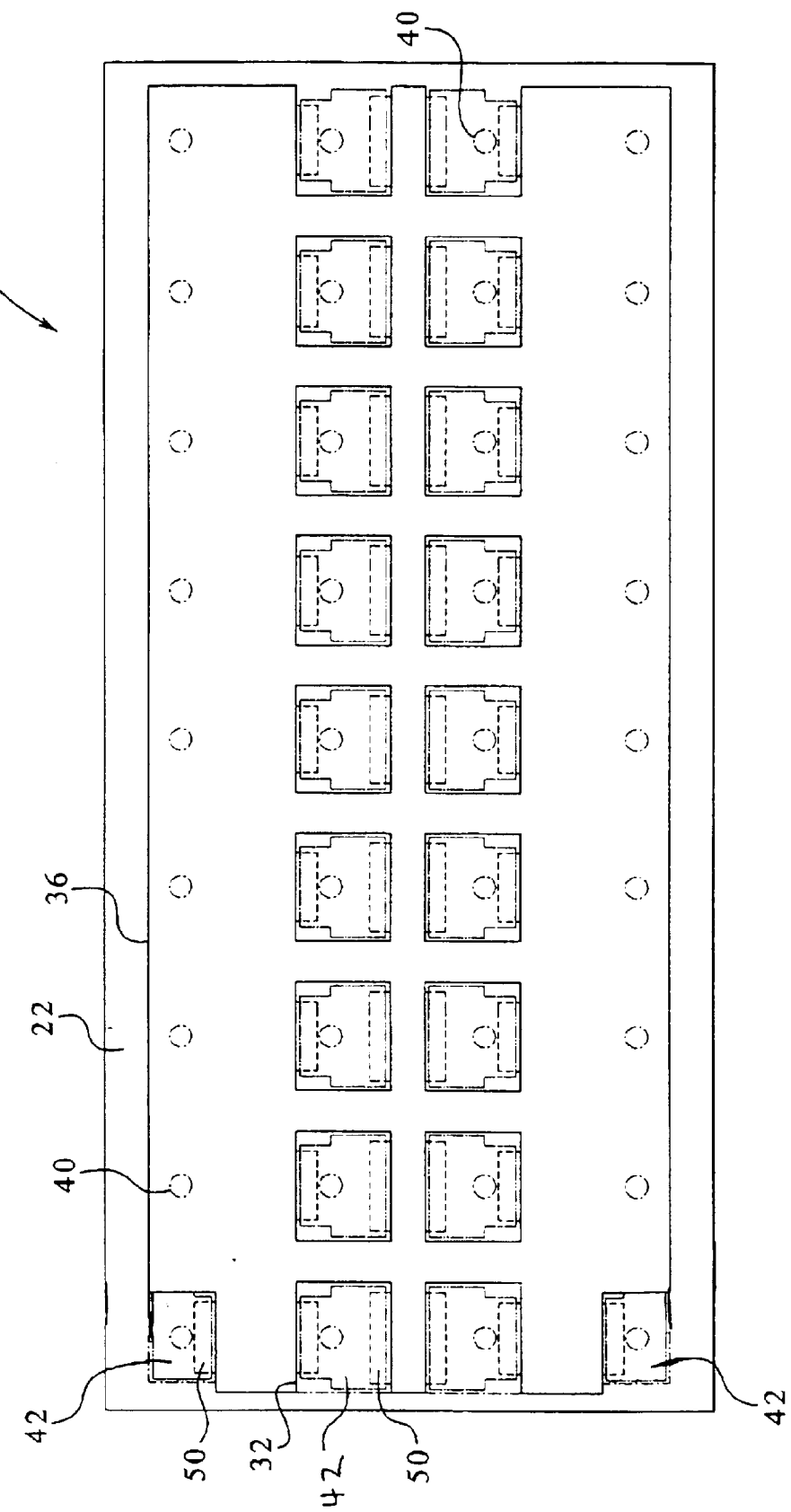
FIG. 2 is a top view of FIG. 1.
Figure 3:
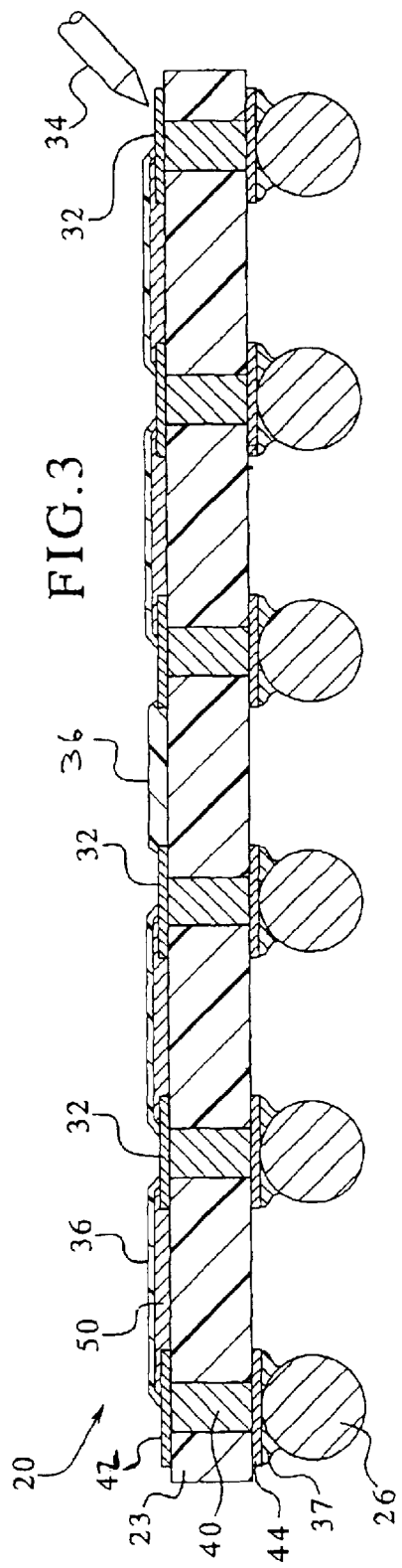
FIG. 3 is a cross-sectional view of FIG. 1.
Figure 4:
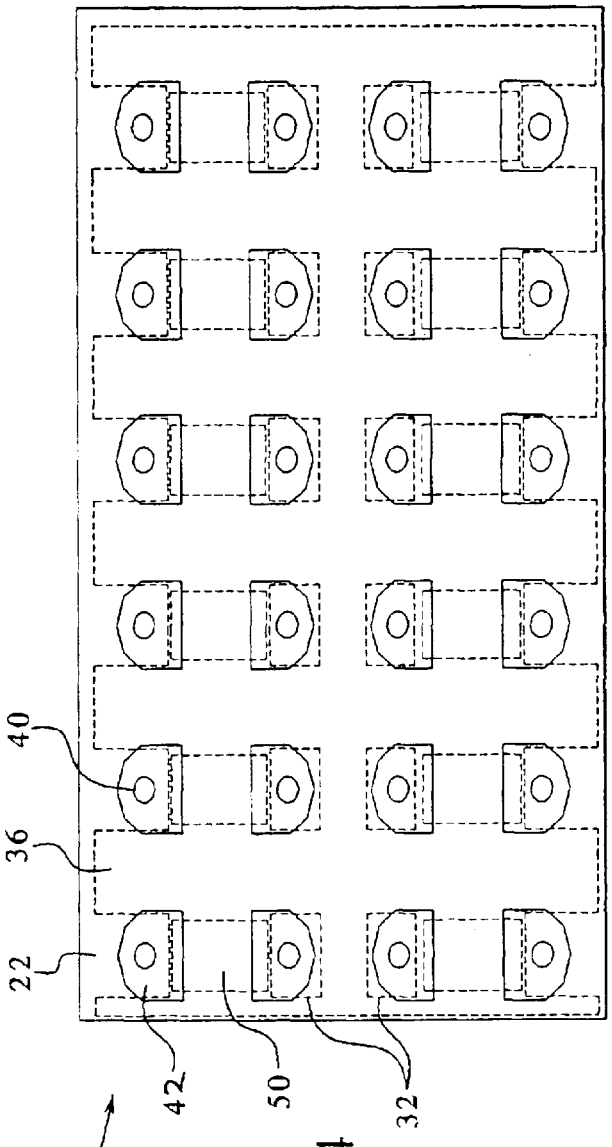
FIG. 4 is a top view of another embodiment of a ball grid array.

Referring to FIGS. 1–4, a ball grid array 20 is shown. Ball grid array 20 has a substrate 23 with a top surface 22 and a bottom surface 24. An array of conductive balls 26 are located on bottom surface 24. Conductive balls 26 are preferably solder balls. Substrate 23 is preferably made out of a ceramic material such as alumina oxide. A passive circuit device 50 is located on top surface 22. Passive circuit device 50 can be a resistor, capacitor or inductor. For this example, passive circuit device 50 will be shown as a resistor. Circuit device or resistor 50 is formed on the top surface by conventional thick film processing techniques. Conductor pads 42 are located on top surface 22. Conductor pads 42 are formed by conventional thick film conductor processing techniques. Conductor pads 42 are located on each end of resistor 50 and are electrically connected to resistor 50. Conductor pads 42 and resistors 50 slightly overlap and sinter to form a mechanical and electrical bond during processing.

A ball pad 44 is located on bottom surface 24. Ceramic substrate 23 has cylindrical vias 40 formed therein and which extend through the substrate and are filled with a conductive via fill material. The via fill material is a conventional thick film conductor that is screened into the vias and fired. The via fill material electrically connects conductors pad 42 with ball pad 44. Conductive Balls or solder spheres 26 are mechanically and electrically attached to the ball pads 44. Solder spheres 26 may be 10% tin and 90% lead and are commercially available from Alpha Metals Corporation. The solder spheres can be other alloys such as 5–20% tin and 80–95% lead.

The solder spheres 26 are attached to ball pads 44 by a re-flowed solder paste 37. Solder sphere 26 typically connects to an external electrical circuit such as on a printed circuit board.

An organic cover coat 36 is placed over top surface 22, resistors 50 and portions of conductor pads 42. Openings 32 are formed in cover coat 36 above selected conductor pads 42. The cover coat 36 protects the resistors and conductor pads from corrosion and abrasion. Openings 32 allow one or more electrical probes 34 to contact conductor pads 42 in order to test the electrical characteristics of the passive circuit device 50. The openings 32 allow for electrical testing of the circuit devices 50 that otherwise could not be tested after the ball grid array 20 is soldered to a printed circuit board.

While the foregoing details what is felt to be the preferred embodiment of the invention, no material limitations to the scope of the claimed invention are intended. Further, features and design alternatives that would be obvious to one of ordinary skill in the art upon a reading of the present disclosure are incorporated herein. The scope of the invention is set forth and particularly described in the claims hereinbelow.

We claim:

1. A ball grid array comprising:
   a) a substrate having a top surface and a bottom surface;
   b) at least first and second conductive pads located on the top surface;
   c) at least first and second ball pads located on the bottom surface;
   d) a resistor located on the top surface between the first and second conductive pads, the resistor having a first end and a second end, the first end being connected to the first conductive pad and the second end being connected to the second conductive pad;
   e) an insulative coating covering the resistor, the top surface and a portion of the first and second conductive pads;

f) a first opening defined in the insulative coating, the first opening being located over at least a portion of the first conductive pad and adapted to allow a first electrical probe to be inserted through the first opening and into contact with the first conductive pad;

g) a second opening defined in the insulative coating, the second opening being located over at least a portion of the second conductive pad and adapted to allow a second electrical probe to be inserted through the second opening and into contact with the second conductive pad wherein, in combination, the conductive pads and the openings allow a test of the electrical characteristics of the resistor to be performed through the first and second electrical probes;

h) at least first and second conductive vias extending through the substrate between the top and bottom surfaces, the first via being electrically connected between the first conductive pad and the first ball pad, and the second via being electrically connected between the respective second conductive pad and the second ball pad; and i) first and second conductive balls mounted to the first and second ball pads respectively.

2. The ball grid array according to claim 1, wherein a plurality of resistors are located on the top surface.

3. The ball grid array according to claim 1, wherein the resistors are arranged in an array of rows and columns.

4. The ball grid array according to claim 1, wherein the insulative coating has a peripheral circumferential edge and at least the first opening is defined along the edge of the coating.

5. A ball grid array resistor network, comprising:
   a) a substrate having a top surface and a bottom surface;
   b) a plurality of conductive pads located on the top surface;
   c) a plurality of resistors located on the top surface, each resistor being located between a pair of conductive pads, the resistors being in electrical contact with the pads, and arranged in an array of rows and columns;
   d) an insulative coating covering the resistor, the top surface and a portion of the conductive pads; and
   e) a plurality of openings in the insulative coating, the openings being located over at least a portion of the respective conductive pads and being adapted to be accessible by at least one electrical probe adapted to contact the conductive pads through the respective openings wherein, in combination, the conductive pads and the openings allow for the testing of the electrical characteristics of the resistors to be performed through the electrical probe.

6. The ball grid array resistor network according to claim 5, wherein the insulative coating has a body and a peripheral circumferential edge and at least one of the plurality of openings are defined along the peripheral edge.

* * * * *